United States Patent
Lei et al.

(10) Patent No.: US 10,050,219 B2
(45) Date of Patent: Aug. 14, 2018

(54) ORGANIC LIGHT-EMITTING DISPLAY PANEL AND DEVICE

(71) Applicants: Shanghai Tianma AM-OLED Co., Ltd., Shanghai (CN); TIANMA MICRO-ELECTRONICS CO., LTD., Shenzhen (CN)

(72) Inventors: Zhihong Lei, Shanghai (CN); Jinghua Niu, Shanghai (CN); Yuji Hamada, Shanghai (CN); Lei Lv, Shanghai (CN)

(73) Assignees: Shanghai Tianma AM-OLED Co., Ltd., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 15/464,288

(22) Filed: Mar. 20, 2017

(65) Prior Publication Data
US 2017/0194588 A1   Jul. 6, 2017

(30) Foreign Application Priority Data
Dec. 15, 2016   (CN) .......................... 2016 1 1159259

(51) Int. Cl.
*H01L 51/50*   (2006.01)
*H01L 27/32*   (2006.01)

(52) U.S. Cl.
CPC ........ *H01L 51/5004* (2013.01); *H01L 51/504* (2013.01); *H01L 51/5012* (2013.01); *H01L 51/5076* (2013.01); *H01L 27/3244* (2013.01); *H01L 2251/552* (2013.01)

(58) Field of Classification Search
CPC .............. H01L 51/5004; H01L 51/504; H01L 51/5012; H01L 51/5076; H01L 2251/552; H01L 27/3244
USPC .......................................................... 257/40
See application file for complete search history.

(56) References Cited

U.S. PATENT DOCUMENTS

| 2012/0121933 A1* | 5/2012 | Ma ...................... H01L 51/5004 |
| | | 428/704 |
| 2017/0125487 A1* | 5/2017 | Song ................... H01L 27/3211 |

FOREIGN PATENT DOCUMENTS

| CN | 1729725 A | 2/2006 |
| CN | 103681760 A | 3/2014 |
| CN | 104795507 A | 7/2015 |

* cited by examiner

*Primary Examiner* — Fernando L Toledo
*Assistant Examiner* — Adam S Bowen
(74) *Attorney, Agent, or Firm* — Kilpatrick Townsend & Stockton LLP

(57) ABSTRACT

An organic light-emitting display panel and an organic light-emitting display device are provided. The organic light-emitting display panel includes: a first electrode, a first light-emitting layer, a second light-emitting layer and a second electrode that are stacked in turn. The ratio of the hole mobility to the electron mobility of the first light-emitting layer is greater than or equal to $10^2$, and the ratio of the electron mobility to the hole mobility of the second light-emitting layer is greater than or equal to $10^2$.

18 Claims, 7 Drawing Sheets

ORGANIC LIGHT-EMITTING DISPLAY PANEL AND DEVICE

CROSS-REFERENCE TO RELATED APPLICATIONS

This application claims priority to Chinese Patent Application No. 201611159259.6, filed on Dec. 15, 2016 and entitled "ORGANIC LIGHT-EMITTING DISPLAY PANEL AND DEVICE", the disclosure of which is incorporated herein by reference in its entirety.

TECHNICAL FIELD

Embodiments of the present disclosure relates to organic light-emitting display technologies, and in particular, to an organic light-emitting display panel and an organic light-emitting display device.

BACKGROUND

Due to the technical advantages of no backlight source, high contrast, small thickness, large visual angle and fast reaction speed, etc., Organic Light-Emitting Display has become one of the important development directions of the display industries.

The existing organic light-emitting display panel includes: a cathode, an electron transport layer, a light-emitting layer, a hole transport layer, an anode and a substrate. During operation, a bias voltage is applied between the anode and the cathode of the organic light-emitting display panel, so that holes and electrons can break through the interfacial energy barrier and migrate respectively from the hole transport layer and the electron transport layer to the light-emitting layer, and on the light-emitting layer, electrons and holes are recombined to generate excitons. The excitons are unstable, and energy can be released. The energy is transferred to the molecules of the organic light-emitting material in the light-emitting layer, so that the molecules transit from a ground state to an excited state. The excited state is very unstable, and thus the excited molecules return to the ground state from the excited state, so that a light emitting phenomenon appears due to radiative transition. Therefore, in the organic light-emitting display panel, the performance of the organic light-emitting display panel is determined by the combination efficiency of the electrons and the holes. However, in the existing organic light-emitting display panel, the recombination efficiency of the electrons and the holes is low, causing the high bias voltage required by the organic light-emitting display panel, the low light-emitting efficiency, and the very short lifetime.

SUMMARY

The present disclosure provides an organic light-emitting display panel and an organic light-emitting display device, thereby improving the combination efficiency of electrons and holes in the organic light-emitting display panel, and hence lowering the bias voltage required by the organic light-emitting display panel, improving the light-emitting efficiency of the organic light-emitting display panel, and prolonging the lifetime of the organic light-emitting display panel.

In a first aspect, embodiments of the present invention provide an organic light-emitting display panel, which includes: a first electrode, a first light-emitting layer, a second light-emitting layer and a second electrode that are stacked in turn. The ratio of the hole mobility to the electron mobility of the first light-emitting layer is larger than or equal to $10^2$, and the ratio of the electron mobility to the hole mobility of the second light-emitting layer is larger than or equal to $10^2$.

In a second aspect, embodiments of the present invention further provide an organic light-emitting display device, which includes any of the organic light-emitting display panels according to the embodiments of the present invention.

In the embodiments of the present invention, by defining the ratio of the hole mobility to the electron mobility of the first light-emitting layer as larger than or equal to $10^2$ and defining the ratio of the electron mobility to the hole mobility of the second light-emitting layer as larger than or equal to $10^2$, it solves the problems of the existing organic light-emitting display panel that due to the low combination efficiency of electrons and holes, the bias voltage required by the organic light-emitting display panel is high, the light-emitting efficiency is low, and the lifetime is very short. With the organic light-emitting display panel according to the embodiments of the present invention, the combination efficiency of electrons and holes may be improved, thereby lowering the bias voltage required by the organic light-emitting display panel, improving the light-emitting efficiency of the organic light-emitting display panel, and prolonging the lifetime of the organic light-emitting display panel.

DETAILED DESCRIPTION

The present invention will be further illustrated in detail in conjunction with the drawings and embodiments. It may be understood that, the specific embodiments described here are only set for explaining, rather than limiting, the present invention. Additionally, it further needs to be noted that, for convenient description, the drawings only show the parts related to the disclosure, rather than the whole contents.

Figure 1A:
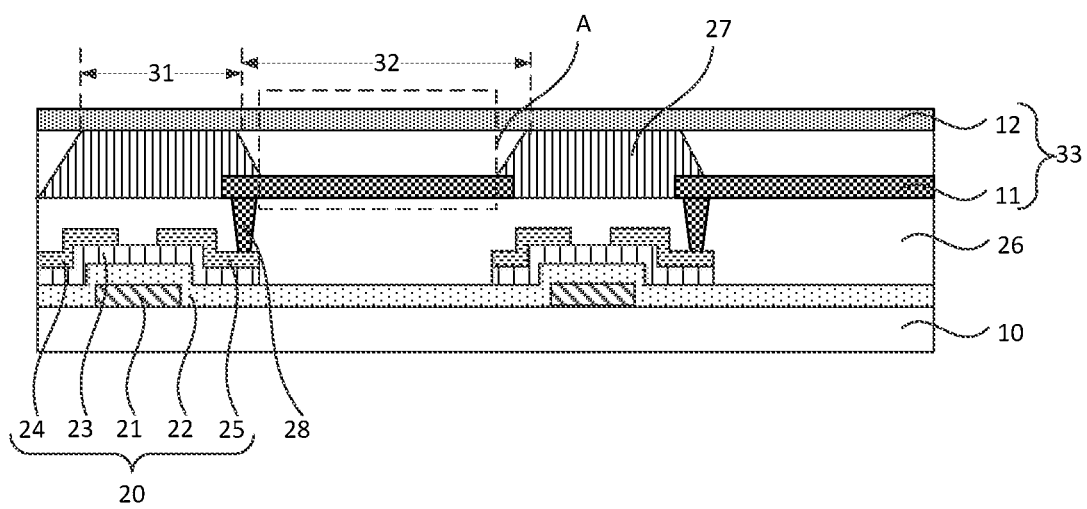
FIG. 1A is a structural representation of an organic light-emitting display panel according to one embodiment of the present invention.

FIG. 1A is a structural representation of an organic light-emitting display panel according to one embodiment of the present invention. Referring to FIG. 1A, the organic light-emitting display panel includes a substrate 10. The substrate 10 is divided into a plurality of pixel regions 32 and non-pixel regions 31, and the pixel regions 32 and the non-pixel regions 31 are provided alternately.

The non-pixel region 31 includes a thin-film transistor 20 formed on the substrate 10 and a pixel-defining layer 27 formed on one side of the thin-film transistor 20 that is away from the substrate 10. The pixel region 32 includes a pixel light-emitting unit 33. The pixel light-emitting unit 33 includes a first electrode 11, a second electrode 12 and a film layer formed between the first electrode 11 and the second electrode 12.

In FIG. 1A, the thin-film transistor 20 may include a gate electrode 21, a gate insulating layer 22, an active layer 23, a source electrode 24 and a drain electrode 25. The thin-film transistor may be a thin-film transistor with a bottom-gate structure (that is, the gate electrode is located between the substrate and the active layer), or it may be a thin-film transistor with a top-gate structure (that is, the active layer is located between the substrate and the gate electrode). Exemplarily, in FIG. 1A, the thin-film transistor 20 is a thin-film transistor with a bottom-gate structure, where the active layer 23 is formed above the gate electrode 21, that is, the gate electrode 21 may be located between the substrate 10 and the active layer 23. The gate electrode 21 may be formed on the substrate 10 and have conductivity. The gate insulating layer 22 may be formed on the gate electrode 21 and cover the gate electrode 21. The gate insulating layer 22 insulates the gate electrode 21 from the active layer 23. The active layer 23 may be formed on the gate insulating layer 22. The active layer 23 may correspond to the gate electrode 21, for example, the active layer 23 may be overlapped with the gate electrode 21. The active layer 13 may include a source region and a drain region that are doped with an N-type or P-type dopant, and a channel region that connects the source region to the drain region. Generally, the source region and the drain region are respectively formed on the two ends of the active layer 23, and the channel region is formed in the middle of the active layer 23. The active layer 23 may include a semiconductor material. The source electrode 24 and the drain electrode 25 may be formed on the active layer 23. The source electrode 24 and the drain electrode 25 may be isolated from each other and electrically connected with each other via the active layer 23 which serves as a channel. The source electrode 24 and the drain electrode 25 may be electrically connected to the source region and the drain region of the active layer 23, respectively. The source electrode 24 and the drain electrode 25 each have conductivity.

The organic light-emitting display panel further includes a planarization layer 26, and the planarization layer 26 may be formed on the entire substrate 10. The planarization layer 26 corresponding to the pixel region 32 is formed with the pixel light-emitting unit 33, and the planarization layer 26 corresponding to the non-pixel region 31 is formed with the pixel-defining layer 27.

The planarization layer 26 is formed with a plurality of through holes 28, and the drain electrode 25 of the thin-film transistor is electrically connected with the first electrode 11 of the pixel light-emitting unit 33 that is located in the pixel region 32. Optionally, as shown in FIG. 1A, in the pixel light-emitting unit 33, the first electrode 11 is formed on the planarization layer 26 corresponding to the pixel region 32, and adjacent two of the pixel-defining layers 27 expose at least one part of the first electrode 11 that is located in the pixel region 32. The second electrode 12 covers the pixel region 32 and the non-pixel region 31.

Figure 1B:
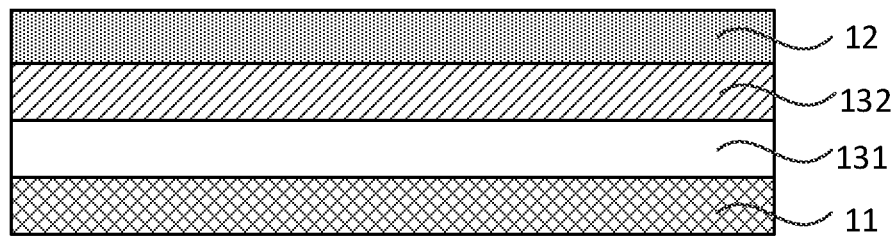
FIG. 1B is a structural representation of dashed area A in FIG. 1A.

FIG. 1B is a structural representation of dashed area A in FIG. 1A. Referring to FIG. 1B, the organic light-emitting display panel includes: a first electrode 11, a first light-emitting layer 131, a second light-emitting layer 132 and a second electrode 12 that are stacked in turn. The ratio of the hole mobility to the electron mobility of the first light-emitting layer 131 is larger than or equal to $10^2$, and the ratio of the electron mobility to the hole mobility of the second light-emitting layer 132 is larger than or equal to $10^2$.

Here, the ratio of the hole mobility to the electron mobility of the first light-emitting layer 131 is larger than or equal to $10^2$, meaning that during specific manufacturing, the material of the first light-emitting layer 131 is selected to meet that the ratio of the hole mobility to the electron mobility is larger than or equal to $10^2$. Thus, the first light-emitting layer 131 can be made to have a very high hole transport efficiency, so that greater number of holes may be injected into the first light-emitting layer 131, and holes may be accelerated to accumulate near the interface between the first light-emitting layer 131 and the second light-emitting layer 132. The ratio of the electron mobility to the hole mobility of the second light-emitting layer 132 is larger than or equal to $10^2$, meaning that during specific manufacturing, the material of the second light-emitting layer 132 is selected to meet that the ratio of the electron mobility to the hole mobility is larger than or equal to $10^2$. Thus, the second light-emitting layer 132 may be made to have a very high electron transport efficiency, so that the greater number of electrons may be injected into the second light-emitting layer 132, and the electrons may be accelerated to accumulate near the interface between the second light-emitting layer 132 and the first light-emitting layer 131.

It may be understood that, the concentration of electrons and holes in the light-emitting layer of the organic light-emitting display panel will influence the combination efficiency of electrons and holes in the light-emitting layer, which determines the light-emitting efficiency and the performance of the organic light-emitting display panel. In the embodiments of the present invention, by defining the ratio of the hole mobility to the electron mobility of the first light-emitting layer being larger than or equal to $10^2$ and defining the ratio of the electron mobility to the hole mobility of the second light-emitting layer being larger than or equal to $10^2$, the concentration of electrons and holes in the light-emitting layer of the organic light-emitting display panel may be improved, so that it facilitate improving the combination efficiency of electrons and holes near the interface between the first light-emitting layer 131 and the second light-emitting layer 132 and lowering the bias voltage required by the organic light-emitting display panel, thereby improving the light-emitting efficiency and the performance of the organic light-emitting display panel.

Optionally, the ratio of the hole mobility of the first light-emitting layer 131 to the electron mobility of the second light-emitting layer 132 is larger than or equal to 0.5 and is smaller than or equal to 2. In such an configuration, the hole transport capacity of the first light-emitting layer 131 is made close to the electron transport capacity of the second light-emitting layer 132, so that carrier balance in the organic light-emitting display panel may be boosted, thereby realizing the high efficiency and the long lifetime of the organic light-emitting display panel. It should be noted that in this embodiment, further optionally, the hole mobility of the first light-emitting layer 131 may be defined as equal to the electron mobility of the second light-emitting layer 132, and in this case, the hole transport capacity of the first light-emitting layer 131 can be made equal to the electron transport capacity of the second light-emitting layer 132, so that carrier balance in the organic light-emitting display panel can be boosted more effectively, thereby realizing the high efficiency and the long lifetime of the organic light-emitting display panel. However, in a practical manufacture process, a certain error range may exist. As a result, optionally, the ratio of the hole mobility of the first light-emitting layer 131 to the electron mobility of the second light-emitting layer 132 may be selected as larger than or equal to 0.5 and smaller than or equal to 2.

Optionally, the sum of the thickness of the first light-emitting layer 131 and the second light-emitting layer 132 is smaller than or equal to 30 nm.

The first light-emitting layer 131 and/or the second light-emitting layer 132 may include at least one host material and at least one guest dopant.

Because in the organic light-emitting display panel, the holes are transported on the highest occupied molecular orbital (HOMO) energy level after being injected from the first electrode 11, and the electrons are transported on the lowest unoccupied molecular orbital (LUMO) energy level after being injected from the second electrode 12, the electrons on the lowest unoccupied molecular orbital (LUMO) energy level are combined with the holes on the highest occupied molecular orbital (HOMO) energy level near the interface between the first light-emitting layer 131 and the second light-emitting layer 132 under the action of a bias voltage. In order to lower the interfacial energy barrier between the light-emitting layers (including the first light-emitting layer 131 and the second light-emitting layer 132) and the electrodes so as to improve the injection capacity of holes or electrons, optionally in the first light-emitting layer 131 or the second light-emitting layer 132, the highest occupied molecular orbital (HOMO) energy level of the host material is higher than the highest occupied molecular orbital (HOMO) energy level of the guest dopant, and the lowest unoccupied molecular orbital (LUMO) energy level of the host material is lower than the lowest unoccupied molecular orbital (LUMO) energy level of the guest dopant; the highest occupied molecular orbital (HOMO) energy level of the guest dopant in the first light-emitting layer 131 is lower than the highest occupied molecular orbital (HOMO) energy level of the guest dopant in the second light-emitting layer 132; the lowest unoccupied molecular orbital (LUMO) energy level of the guest dopant in the first light-emitting layer 131 is lower than the lowest unoccupied molecular orbital (LUMO) energy level of the guest dopant in the second light-emitting layer 132.

Exemplarily, the first light-emitting layer 131 includes a first host material and a first guest dopant, and the second light-emitting layer 132 includes a second host material, a second guest dopant and a third guest dopant; the highest occupied molecular orbital (HOMO) energy level of the first host material is higher than the highest occupied molecular orbital (HOMO) energy level of the first guest dopant; the highest occupied molecular orbital (HOMO) energy level of the second host material is higher than the highest occupied molecular orbital (HOMO) energy level of the second guest dopant and the highest occupied molecular orbital (HOMO) energy level of the third guest dopant; the highest occupied molecular orbital (HOMO) energy level of the first guest dopant is lower than the highest occupied molecular orbital (HOMO) energy level of the second guest dopant and the highest occupied molecular orbital (HOMO) energy level of the third guest dopant; the highest occupied molecular orbital (HOMO) energy level of the second guest dopant is lower than the highest occupied molecular orbital (HOMO) energy level of the third guest dopant; the lowest unoccupied molecular orbital (LUMO) energy level of the first host material is lower than the lowest unoccupied molecular orbital (LUMO) energy level of the first guest dopant; the lowest unoccupied molecular orbital (LUMO) energy level of the second host material is lower than the lowest unoccupied molecular orbital (LUMO) energy level of the second guest dopant and the lowest unoccupied molecular orbital (LUMO) energy level of the third guest dopant; the lowest unoccupied molecular orbital (LUMO) energy level of the first guest dopant is lower than the lowest unoccupied molecular orbital (LUMO) energy level of the second guest dopant and the lowest unoccupied molecular orbital (LUMO) energy level of the third guest dopant; the lowest unoccupied molecular orbital (LUMO) energy level of the second guest dopant is higher than the lowest unoccupied molecular orbital (LUMO) energy level of the third guest dopant.

Figure 2:
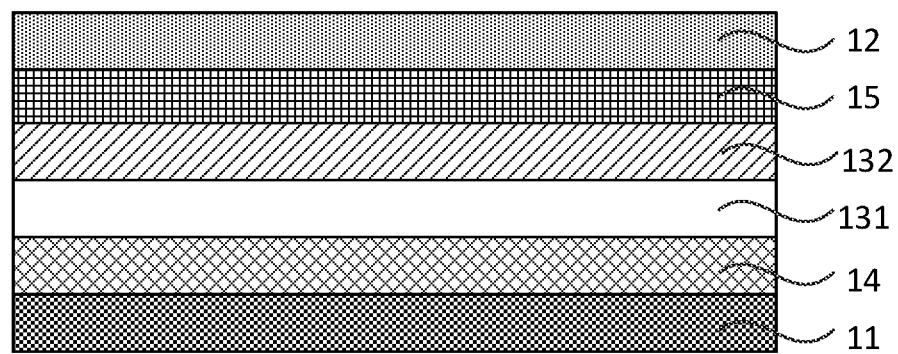
FIG. 2 is a structural representation of a part of film layers of another organic light-emitting display panel according to one embodiment of the present invention.

FIG. 2 is a structural representation of a partial film of another organic light-emitting display panel according to one embodiment of the present invention. In comparison with FIG. 1B, in FIG. 2, the organic light-emitting display panel further includes a first auxiliary light-emitting layer 14 and a second auxiliary light-emitting layer 15. Specifically, referring to FIG. 2, the first auxiliary light-emitting layer 14 is located between the first electrode 11 and the first light-emitting layer 131; the first auxiliary light-emitting layer 14 includes at least one of a hole-injecting layer, a hole transport layer and an electron blocking layer. The second auxiliary light-emitting layer 15 is located between the second electrode 12 and the second light-emitting layer 132; the second auxiliary light-emitting layer includes at least one of an electron-injecting layer, an electron transport layer and a hole blocking layer.

It should be noted that, in FIG. 2, the organic light-emitting display panel includes both the first auxiliary light-emitting layer 14 and the second auxiliary light-emitting layer 15, which this is merely a specific example of the disclosure, rather than limiting the disclosure. During specific manufacturing, the organic light-emitting display panel may include only the first auxiliary light-emitting layer 14, or include only the second auxiliary light-emitting layer 15.

Optionally, if the organic light-emitting display panel includes the second auxiliary light-emitting layer 15, the second auxiliary light-emitting layer 15 is doped with at least one of an alkali metal, an alkaline earth metal or a rare-earth metal. Exemplarily, the second auxiliary light-emitting layer 15 includes an electron transport layer; optionally, the electron transport layer is doped with at least one of an alkali metal, an alkaline earth metal or a rare-earth metal. In such a configuration, the interfacial energy barrier between the first electrode 12 and the organic material of the organic light-emitting display panel may be reduced, so that the electron injection capacity and the performance of the organic light-emitting display panel may be improved. Typically, the electron transport layer may be doped with at least one of lithium, natrium, kalium, rubidium, cesium, magnesium, calcium, strontium, barium, ytterbium, samarium or gadolinium.

In the above technical solutions, optionally, the first electrode 11 and/or the second electrode 12 may be taken as a light exit side electrode (that is, the electrode via which the light is emitted to the outside) of the organic light-emitting display panel, which will be illustrated in detail below by a typical example.

Figure 3:
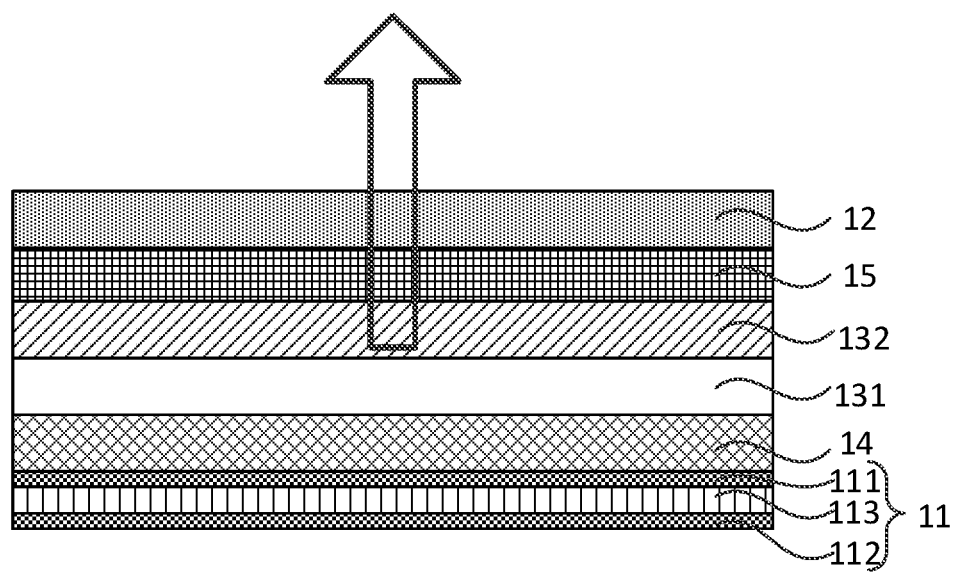
FIG. 3 is a structural representation of a part of film layers of yet another organic light-emitting display panel according to one embodiment of the present invention.

FIG. 3 is a structural representation of a part of film layers of yet another organic light-emitting display panel according to one embodiment of the present invention. Referring to FIG. 3, the organic light-emitting display panel only takes the second electrode 12 as the light exit side electrode. After being formed near the interface between the first light-emitting layer 131 and the second light-emitting layer 132, the light is emitted out via the second electrode 12. Specifically, the first electrode 11 may include a first conductive transparent film 111, a second conductive transparent film 112 and a reflective film 113 that is located between the first conductive transparent film 111 and the second conductive transparent film 112. Optionally, in specific design, the material and the thickness of each of the films of the first electrode 11 may vary, so long as it can guarantee that the first electrode 11 has an excellent hole injection capacity and an excellent reflection effect. For example, the material of the first conductive transparent film 111 and the second conductive transparent film 112 in the first electrode 11 may be tin indium oxide, zinc indium oxide or a mixture of aluminum oxide and zinc oxide, the material of the reflective film 113 may be silver or a silver-containing alloy, and the thickness of the reflective film 113 may be 50 nm-150 nm. The material of the light exit side electrode (the second electrode 12) may be silver or a silver-containing alloy. The thickness of the light exit side electrode (the second electrode 12) may vary, so long as it can guarantee that the light exit side electrode (the second electrode 12) has an excellent electron injection capacity and a good light transmissibility. For example, the material of the light exit side electrode (the second electrode 12) may be a silver-containing alloy, where the percentage of volume of the silver contained in the alloy is larger than or equal to 80%, and the thickness of the light exit side electrode, i.e., the second electrode 12, is 10 nm-20 nm. Based on this, in order to make the organic light-emitting display panel have a good display effect, optionally the transmissibility of the light exit side electrode (the second electrode 12) under the light with a wavelength of 550 nm is larger than or equal to 20% and is smaller than or equal to 50%.

Figure 4:
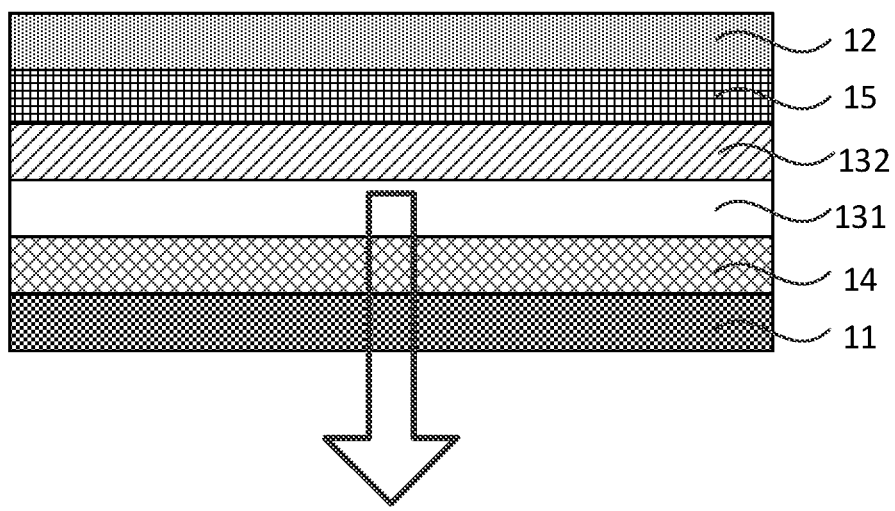
FIG. 4 is a structural representation of a part of film layers of yet another organic light-emitting display panel according to one embodiment of the present invention.

FIG. 4 is a structural representation of a part of film layers of yet another organic light-emitting display panel according to one embodiment of the present invention. Referring to FIG. 4, the organic light-emitting display panel only takes the first electrode 11 as the light exit side electrode. After being formed near the interface between the first light-emitting layer 131 and the second light-emitting layer 132, the light is emitted out via the first electrode 11. Specifically, the material of the first electrode 11 is a conductive transparent material, and during specific design, the material and the thickness of the first electrode 11 may vary, so long as it can guarantee that the first electrode 11 has an excellent hole injection capacity and a good light transmissibility. For example, the conductive transparent film of the first electrode 11 may be made from material of tin indium oxide, zinc indium oxide or a mixture of aluminum oxide and zinc oxide. The material of the second electrode 12 may be silver or a silver-containing alloy. The thickness of the second electrode 12 may vary, so long as it can guarantee that the second electrode 12 has an excellent electron injection capacity and a good reflection effect. For example, the material of the second electrode 12 may be a silver-containing alloy, where the percentage of volume of the silver contained in the alloy is larger than or equal to 80%, and the thickness of the second electrode 12 may be 50 nm-150 nm.

Figure 5:
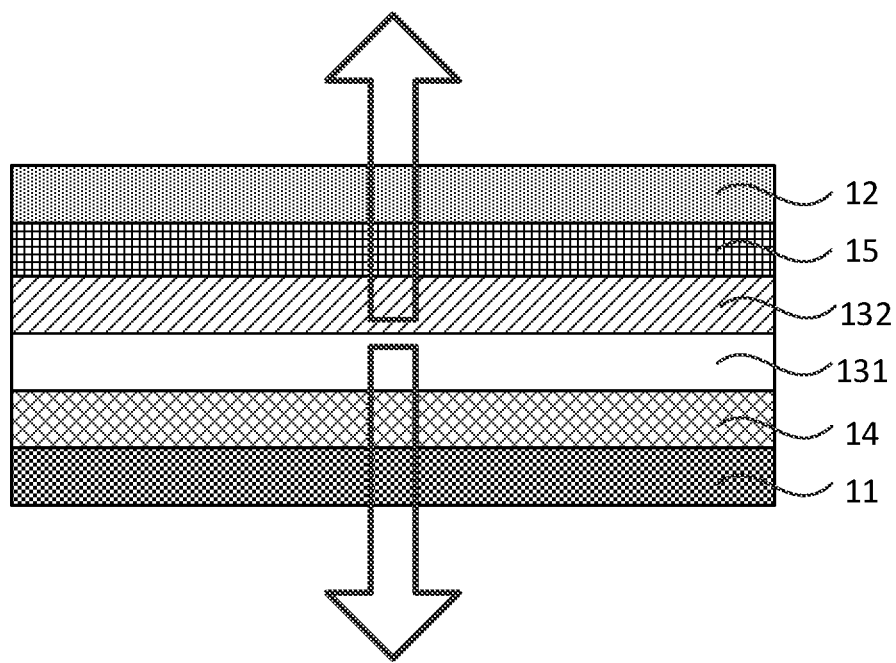
FIG. 5 is a structural representation of a part of film layers of yet another organic light-emitting display panel according to one embodiment of the present invention.

FIG. 5 is a structural representation of a part of film layers of yet another organic light-emitting display panel according to one embodiment of the present invention. Referring to FIG. 5, the organic light-emitting display panel takes both the first electrode 11 and the second electrode 12 as the light exit side electrode. After the light is formed near the interface between the first light-emitting layer 131 and the second light-emitting layer 132, one part thereof is emitted out via the first electrode 11, and the other part thereof is emitted out via the second electrode 12.

It should be noted that, during the manufacturing of the organic light-emitting display panel provided in this application, the first electrode 11 may be first formed on a substrate, then film layers may be formed in turn between the first electrode 11 and the second electrode 12, and the second electrode 12 is formed finally; or alternatively, the second electrode 12 may be first formed on the substrate, then film layers may be formed in turn between the first electrode 11 and the second electrode 12, and the first electrode 11 is formed finally. That is, the organic light-emitting display panel may have an upright structure or an inversed structure.

Figure 6:
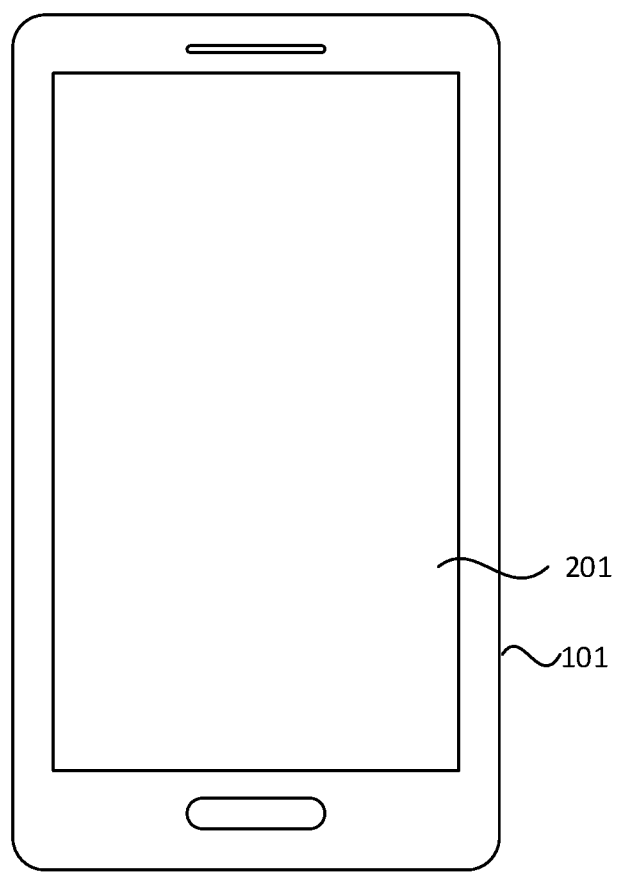
FIG. 6 is a structural representation of an organic light-emitting display device according to one embodiment of the present invention.

One embodiment of the present invention further provides an organic light-emitting display device. FIG. 6 is a structural representation of an organic light-emitting display device according to one embodiment of the present invention. Referring to FIG. 6, the organic light-emitting display device 101 includes any organic light-emitting display panel 201 of the embodiments of the present invention. Specifically, the organic light-emitting display device may be a mobile phone, a notebook computer, an intelligent wearable device and an information inquiry machine in a public hall.

In the organic light-emitting display device according to the embodiment of the present invention, by defining the ratio of the hole mobility to the electron mobility of the first light-emitting layer as larger than or equal to $10^2$ and defining the ratio of the electron mobility to the hole mobility of the second light-emitting layer as larger than or equal to $10^2$, it solves the problems of the existing organic light-emitting display panel that due to the low combination efficiency of electrons and holes, the bias voltage required by the organic light-emitting display panel is high, the light-emitting efficiency is low, and the lifetime is very short. Thus, with the organic light-emitting display device according to the embodiment of the present invention, the combination efficiency of electrons and holes may be improved, thereby lowering the bias voltage required by the organic light-emitting display panel, improving the light-emitting efficiency of the organic light-emitting display panel, and prolonging the lifetime of the organic light-emitting display panel.

It should be noted that the embodiments of the present invention and the technical principles used therein are described as above. It should be appreciated that the disclosure is not limited to the particular embodiments described herein, and any apparent alterations, modification and substitutions can be made without departing from the scope of protection of the disclosure. Accordingly, while the disclosure is described in detail through the above embodiments, the disclosure is not limited to the above embodiments and can further include other additional embodiments without departing from the concept of the disclosure.

What is claimed is:
1. An organic light-emitting display panel, comprising:
a first electrode, a first auxiliary light-emitting layer, a first light-emitting layer, a second light-emitting layer, a second auxiliary light-emitting layer and a second electrode that are stacked in turn; wherein
a ratio of a hole mobility to an electron mobility of the first light-emitting layer is greater than or equal to $10^2$, and a ratio of an electron mobility to a hole mobility of the second light-emitting layer is greater than or equal to $10^2$;

the first auxiliary light-emitting layer comprises at least one of a hole-injecting layer, a hole transport layer, and an electron blocking layer; and the second light-emitting layer and the second auxiliary light-emitting layer comprise at least one of an electron-injecting layer, an electron transport layer, and a hole blocking layer.

2. The organic light-emitting display panel according to claim 1, wherein a ratio of the hole mobility of the first light-emitting layer to the electron mobility of the second light-emitting layer is greater than or equal to 0.5 and is less than or equal to 2.

3. The organic light-emitting display panel according to claim 1, wherein a sum of a thickness of the first light-emitting layer and a thickness of the second light-emitting layer is less than or equal to 30 nm.

4. The organic light-emitting display panel according to claim 1, wherein at least one of the first light-emitting layer and the second light-emitting layer comprises at least one host material and at least one guest dopant.

5. The organic light-emitting display panel according to claim 4, wherein in the first light-emitting layer or the second light-emitting layer, a highest occupied molecular orbital energy level of the host material is higher than a highest occupied molecular orbital energy level of the guest dopant, and a lowest unoccupied molecular orbital energy level of the host material is lower than a lowest unoccupied molecular orbital energy level of the guest dopant;

the highest occupied molecular orbital energy level of the guest dopant in the first light-emitting layer is lower than the highest occupied molecular orbital energy level of the guest dopant in the second light-emitting layer; and the lowest unoccupied molecular orbital energy level of the guest dopant in the first light-emitting layer is lower than the lowest unoccupied molecular orbital energy level of the guest dopant in the second light-emitting layer.

6. The organic light-emitting display panel according to claim 5, wherein the first light-emitting layer comprises a first host material and a first guest dopant, and the second light-emitting layer comprises a second host material, a second guest dopant and a third guest dopant;

the highest occupied molecular orbital energy level of the first host material is higher than the highest occupied molecular orbital energy level of the first guest dopant;

the highest occupied molecular orbital energy level of the second host material is higher than the highest occupied molecular orbital energy level of the second guest dopant and the highest occupied molecular orbital energy level of the third guest dopant;

the highest occupied molecular orbital energy level of the first guest dopant is lower than the highest occupied molecular orbital energy level of the second guest dopant and the highest occupied molecular orbital energy level of the third guest dopant;

the highest occupied molecular orbital energy level of the second guest dopant is lower than the highest occupied molecular orbital energy level of the third guest dopant;

the lowest unoccupied molecular orbital energy level of the first host material is lower than the lowest unoccupied molecular orbital energy level of the first guest dopant;

the lowest unoccupied molecular orbital energy level of the second host material is lower than the lowest unoccupied molecular orbital energy level of the second guest dopant and the lowest unoccupied molecular orbital energy level of the third guest dopant;

the lowest unoccupied molecular orbital energy level of the first guest dopant is lower than the lowest unoccupied molecular orbital energy level of the second guest dopant and the lowest unoccupied molecular orbital energy level of the third guest dopant; and the lowest unoccupied molecular orbital energy level of the second guest dopant is higher than the lowest unoccupied molecular orbital energy level of the third guest dopant.

7. The organic light-emitting display panel according to claim 1, wherein the electron transport layer is doped with at least one of an alkali metal, an alkaline earth metal and a rare-earth metal.

8. The organic light-emitting display panel according to claim 7, wherein the electron transport layer is doped with at least one of lithium, natrium, kalium, rubidium, cesium, magnesium, calcium, strontium, barium, ytterbium, samarium and gadolinium.

9. The organic light-emitting display panel according to claim 1, wherein at least one of the first electrode and the second electrode is a light exit side electrode of the organic light-emitting display panel.

10. The organic light-emitting display panel according to claim 9, wherein the second electrode is a light exit side electrode of the organic light-emitting display panel; and the first electrode comprises a first conductive transparent film, a second conductive transparent film and a reflective film located between the first conductive transparent film and the second conductive transparent film.

11. The organic light-emitting display panel according to claim 10, wherein the material of the first conductive transparent film and the second conductive transparent film is tin indium oxide, zinc indium oxide or a mixture of aluminum oxide and zinc oxide, and the material of the reflective film is silver or a silver-containing alloy.

12. The organic light-emitting display panel according to claim 11, wherein a thickness of the reflective film is greater than or equal to 50 nm and is less than or equal to 150 nm.

13. The organic light-emitting display panel according to claim 10, wherein the material of the light exit side electrode is silver or a silver-containing alloy.

14. The organic light-emitting display panel according to claim 13, wherein a thickness of the light exit side electrode is greater than or equal to 10 nm and is less than or equal to 20 nm.

15. The organic light-emitting display panel according to claim 13, wherein transmittance of the light exit side electrode is a greater than or equal to 20% and is less than or equal to 50% under light with a wavelength of 550 nm.

16. The organic light-emitting display panel according to claim 9, wherein
the first electrode is a light exit side electrode of the organic light-emitting display panel; and
the first electrode is made of a conductive transparent material.

17. The organic light-emitting display panel according to claim 16, wherein
the conductive transparent material is tin indium oxide, zinc indium oxide or a mixture of aluminum oxide and zinc oxide.

18. An organic light-emitting display device, comprising:
an organic light-emitting display panel, comprising:
a first electrode, a first auxiliary light-emitting layer, a first light-emitting layer, a second light-emitting layer, a second auxiliary light-emitting layer and a second electrode that are stacked in turn; wherein
a ratio of a hole mobility to an electron mobility of the first light-emitting layer is greater than or equal to $10^2$, and a ratio of an electron mobility to a hole mobility of the second light-emitting layer is greater than or equal to $10^2$;
the first auxiliary light-emitting layer comprises at least one of a hole-injecting layer, a hole transport layer, and an electron blocking layer; and
the second light-emitting layer and the second auxiliary light-emitting layer comprise at least one of an electron-injecting layer, an electron transport layer, and a hole blocking layer.

* * * * *